United States Patent [19]
Harr

[11] Patent Number: 5,926,068
[45] Date of Patent: Jul. 20, 1999

[54] VARIABLE GAIN AMPLIFIER OR ANALOG MULTIPLEXER WITH FEEDFORWARD CURRENT BLOCKING

[75] Inventor: Jerome D. Harr, San Jose, Calif.

[73] Assignee: Kabushiki Kaisha Toshiba, Kawasaki, Japan

[21] Appl. No.: 08/951,962

[22] Filed: Oct. 16, 1997

[51] Int. Cl.$^6$ .................................................. H03F 3/45
[52] U.S. Cl. ............................................ 330/254; 327/359
[58] Field of Search ...................... 330/254, 252, 330/261; 327/359, 356

[56] References Cited

U.S. PATENT DOCUMENTS

| | | | |
|---|---|---|---|
| 3,969,683 | 7/1976 | Fabricius | 330/144 |
| 4,068,228 | 1/1978 | Vallas | 341/109 |
| 4,081,757 | 3/1978 | Rumbaugh | 330/124 R |
| 4,117,418 | 9/1978 | Hoglund | 330/296 |
| 4,236,088 | 11/1980 | Horiuchi et al. | 327/407 |
| 4,961,057 | 10/1990 | Ibukuro | 330/295 |
| 4,996,498 | 2/1991 | Hanna | 330/258 |
| 5,057,788 | 10/1991 | Ushida et al. | 330/261 |
| 5,066,926 | 11/1991 | Ramachandran et al. | 330/311 |
| 5,180,989 | 1/1993 | Sakurai et al. | 330/295 |
| 5,274,342 | 12/1993 | Wen et al. | 330/295 |
| 5,352,987 | 10/1994 | Harvey | 330/51 |
| 5,418,494 | 5/1995 | Betti et al. | 330/254 |
| 5,572,165 | 11/1996 | Madni | 330/252 |

*Primary Examiner*—Robert Pascal
*Assistant Examiner*—Patricia Nguyen
*Attorney, Agent, or Firm*—Limbach & Limbach LLP

[57] ABSTRACT

A variable gain amplifier has a plurality of amplifying stages. Each amplifying stage has a pair of cascode transistors that provide a low impedance path to signal currents when operating in the signal transmission mode and a high impedance to unwanted feedforward current when operating in a blocking mode. In a preferred embodiment, a pair of cascode transistors can also be shared among a plurality of amplifying stages of the variable gain amplifier. Further, when different pairs of input signals are provided to different amplifying stages, the circuit can be used as an analog multiplexer.

17 Claims, 7 Drawing Sheets

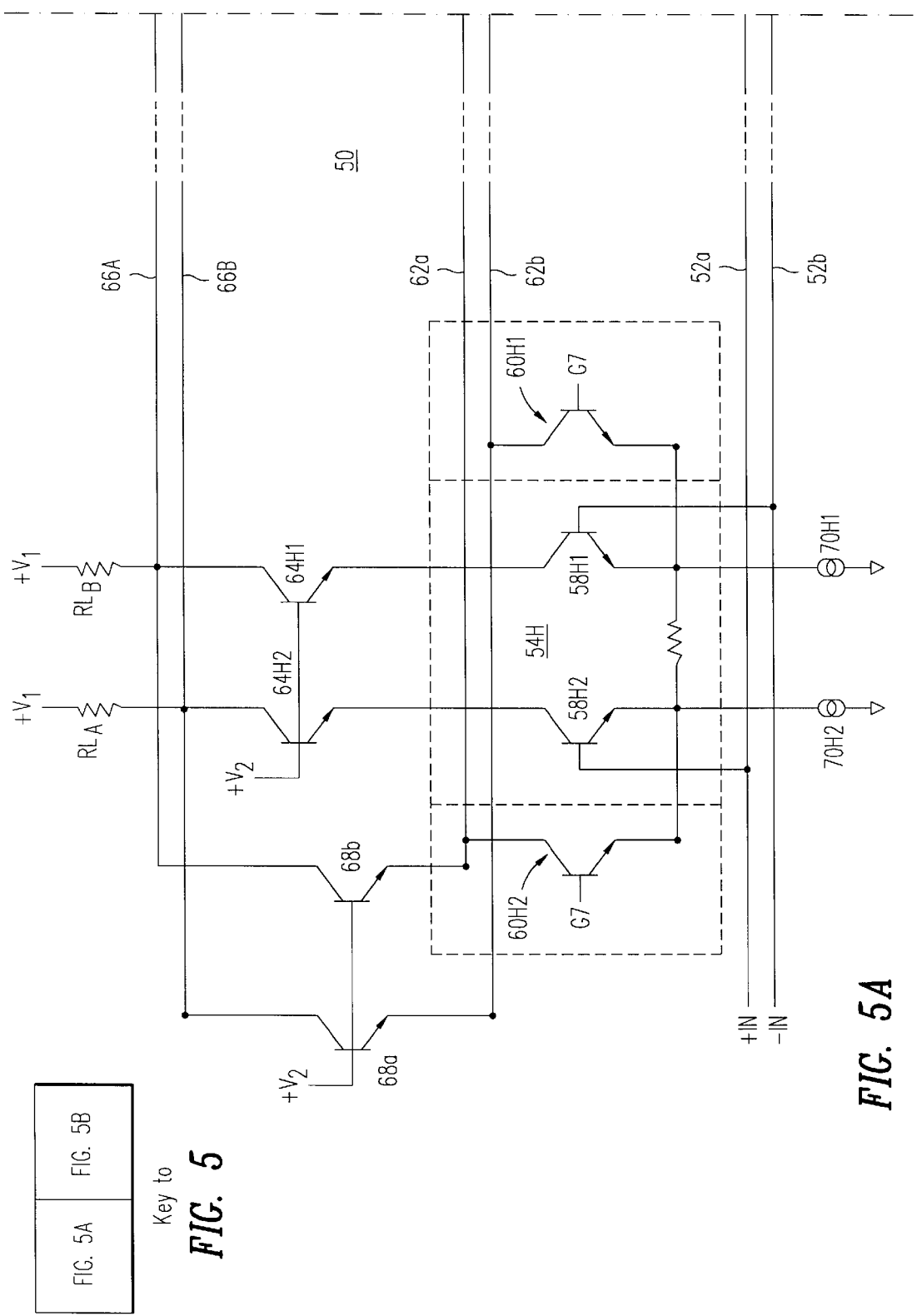

Key to FIG. 6

| FIG. 6A | FIG. 6B |

VARIABLE GAIN AMPLIFIER OR ANALOG MULTIPLEXER WITH FEEDFORWARD CURRENT BLOCKING

TECHNICAL FIELD

The present invention relates to a circuit that can be used either as a variable gain amplifier with feedforward current blocking or an analog multiplexer with feedforward current blocking. Cascode transistor pairs provide for either a low impedance path to signal currents when operating in signal transmission mode or a high impedance to unwanted feedforward currents when operating in a blocking mode.

BACKGROUND OF THE INVENTION

Variable gain amplifiers are well known in the art. Typically, they are designed for digital gain control and for use in telecommunication circuits such as GSM (Global System for Mobile Communication) telephone receivers. Such circuits operate at high frequencies such as 246 MHz.

One common prior art circuit for providing a digitally controlled gain is shown in FIG. 1. A plurality of transconducting amplifiers 12(a–h) are connected to a pair of common output resistors RL. The output currents are switched either into or away from these output resistors to control the gain. As shown, for example, in FIG. 1, a variable gain amplifier (VGA) 10 of the prior art comprises a plurality of eight (8) transconductance amplifiers 12(a–h) connected in parallel. Each of the transconductance amplifiers 12(a–h) receives the input signals +IN and –IN. Each of the transconductance amplifiers 12(a–h) generates a pair of output signals which are supplied to an associated switch 14(b–h). Since the VGA 10 has to have at least one stage of amplification, the output of the first stage amplifier 12a has its associated switch 14a in the closed position at all time. The outputs of each of the associated switches 14(b–h) are then connected in parallel to a pair of output buses –OUT and +OUT, which are connected to a pair of resistors RL.

Each of the eight amplifiers 12(a–h) provides an output current which is proportional to the voltage input. Except for the first amplifier 12a, each of the other amplifiers 12(b–h) may be selectively connected to the load resistors RL to augment the gain of the other amplifiers. Each of the amplifiers 12(b–h) provides an additional two dB gain when its associated switch 14(b–h) is closed. Set forth below is a chart showing the switch settings necessary to program the gain from –3 dB to +11 dB in 2 dB steps (assuming that each of the amplifiers 12 can amplify in 2 dB gain increment).

Referring to FIG. 2, there is shown a detailed schematic circuit diagram of the VGA 10 of the prior art whose block diagram is shown in FIG. 1. The transistors 20a and 20b are commonly used in a cascode configuration connecting the collector of the transistors 18 of the amplifiers 12(a–h) to the output lines +OUT and –OUT. This is to improve the bandwidth. The associated switches 14(a–h) are typically implemented as transistors. As previously discussed, the base for the transistors shown in switches 14a1 and 14a2 would be connected to ground which is in the "ON" position thereby "permanently" connecting amplifier 12a to receive the input signals +IN and –IN and to generate output signals supplied to the output lines +OUT and –OUT. The emitters of the switches 14 are connected to the emitters of the associated amplifier 12 and the collectors are connected to the collectors of the associated amplifier 12. The purpose of the transistors in the switches 14(a–h) is to shunt the current from the current sources 16 around the transistors 18 and directly to the buses 22a and 22b, thereby giving a zero transconductance for the amplifying stage.

The collectors of the switches 14(a–h) are connected to the collectors of the transistors 18 of the associated amplifier 12 rather than to a power supply to keep the DC current level in the load resistors RLA and RLB substantially constant so that the DC output voltage does not vary substantially as a result of selecting a new gain. Finally, of course, the switches 14(a–h) associated with each amplifier 12(a–h) can be switched to turn on or off the associated current sources 16×1 and 16×2 associated with each amplifier, instead of using switching transistors as shown in FIG. 2.

The prior art VGA circuit 10 works relatively well for high gains. However, when all the switches are off (except for switch 14a) which results in low gain, the collector-base capacitance of the "OFF" amplifying transistors 18 in each of the amplifiers 12(b–h) would still be present. Thus, the collector-base capacitance of transistors 18(b–h)2 and 18(b–h)1 for the amplifiers 12(b–h) would still be present even though the associated switches 14(b–h) are off. This collector-base capacitance provides a feedforward path for the signal from the inputs +IN and –IN directly to the common collector buses of 22a and 22b. If minimum gain is desired, i.e. only one amplifier stage (amplifier 12a) is on then the other seven amplifiers 12(b–h) would contribute substantial unwanted signal current through this collector-base capacitance. As a result, this feedforward current produces an unwanted peaking in the frequency response of the VGA amplifier 10 as shown in FIG. 3. As frequencies increase, more and more current flows through the collector-base capacitors resulting in a peak in the frequency near the

TABLE I

Gain vs. Switch Setting

| GAIN | SW0 | SW1 | SW2 | SW3 | SW4 | SW5 | SW6 | SW7 |
|---|---|---|---|---|---|---|---|---|
| –3 dB | CLOSED | CLOSED | CLOSED | CLOSED | CLOSED | CLOSED | CLOSED | CLOSED |
| –1 dB | OPEN | CLOSED | CLOSED | CLOSED | CLOSED | CLOSED | CLOSED | CLOSED |
| +1 dB | OPEN | OPEN | CLOSED | CLOSED | CLOSED | CLOSED | CLOSED | CLOSED |
| +3 dB | OPEN | OPEN | OPEN | CLOSED | CLOSED | CLOSED | CLOSED | CLOSED |
| +5 dB | OPEN | OPEN | OPEN | OPEN | CLOSED | CLOSED | CLOSED | CLOSED |
| +7 dB | OPEN | OPEN | OPEN | OPEN | OPEN | CLOSED | CLOSED | CLOSED |
| +9 dB | OPEN | OPEN | OPEN | OPEN | OPEN | OPEN | CLOSED | CLOSED |
| +11 dB | OPEN | OPEN | OPEN | OPEN | OPEN | OPEN | OPEN | CLOSED |

As the switch 14(b–h) associated with each amplifier 12(b–h) is closed, it contributes a current into the output resistors RL which increases the output signal by 2dB.

bandwidth limit of the amplifier. This problem is more severe at the lowest gain where most of the amplifiers are supposed to be off but instead pass this unwanted feedforward current. The problem is least severe at high gains where the VGA amplifier 10 is supposed to pass the signal anyway.

Referring to FIG. 4, there is shown an analog multiplexer 30 of the prior art. This is shown and is described in U.S. Pat. No. 5,352,987. The analog multiplexer 30, instead of having a common pair of input buses, receives a plurality of pairs of input signals such as $IN_{A1}$, $IN_{A2}$; $IN_{B1}$, $IN_{B2}$ ... $IN_{N1}$, and $IN_{N2}$. Each pair of input signals is supplied to the base of a pair of first transistors, whose emitters are connected to a current source. The collectors of the pair of first transistors are connected to the emitters of a pair of control transistors whose bases are supplied with a control logic signal. The collectors of the control transistors are tied to a fixed voltage. The common nodes of the collectors of the first transistors and the emitters of the control transistors are then connected to the emitters of a pair of second transistors whose bases are tied to a bias voltage. Finally, the collectors of the second transistors are connected to the output of an amplifier. In this manner, the base-emitter capacitance of the second transistors effectively couples the high frequency signal to the bias supply connected to the bases of the second transistors and is effectively shunted away from the inputs to the main amplifier (see Col. 2, lines 65-Col. 3, line 2).

SUMMARY OF THE INVENTION

In the present invention, a variable gain amplifier has a plurality of input stages. Each input stage has a pair of transistors having bases, collectors and emitters. The emitters are connected to receive a bias signal and the bases are connected for receiving input signals. A logic means is associated with each input stage. The logic means includes a pair of transistors having bases, collectors and emitters. The emitters are commonly connected to the emitters of the associated input stage. The bases receive the logic signals for selectively shunting collector currents therethrough in response to applied logic signals. A pair of by-pass buses is coupled to a pair of output buses and to the collectors of the logic means. A pair of coupling transistors having bases, collectors and emitters are connected with their emitters to the collectors of at least one input stage and with the collectors connected to the pair of output buses and with the bases connected to a source of bias signal.

The present invention can also be used as an analog multiplexer.

DETAILED DESCRIPTION OF THE DRAWINGS

Figure 5B:
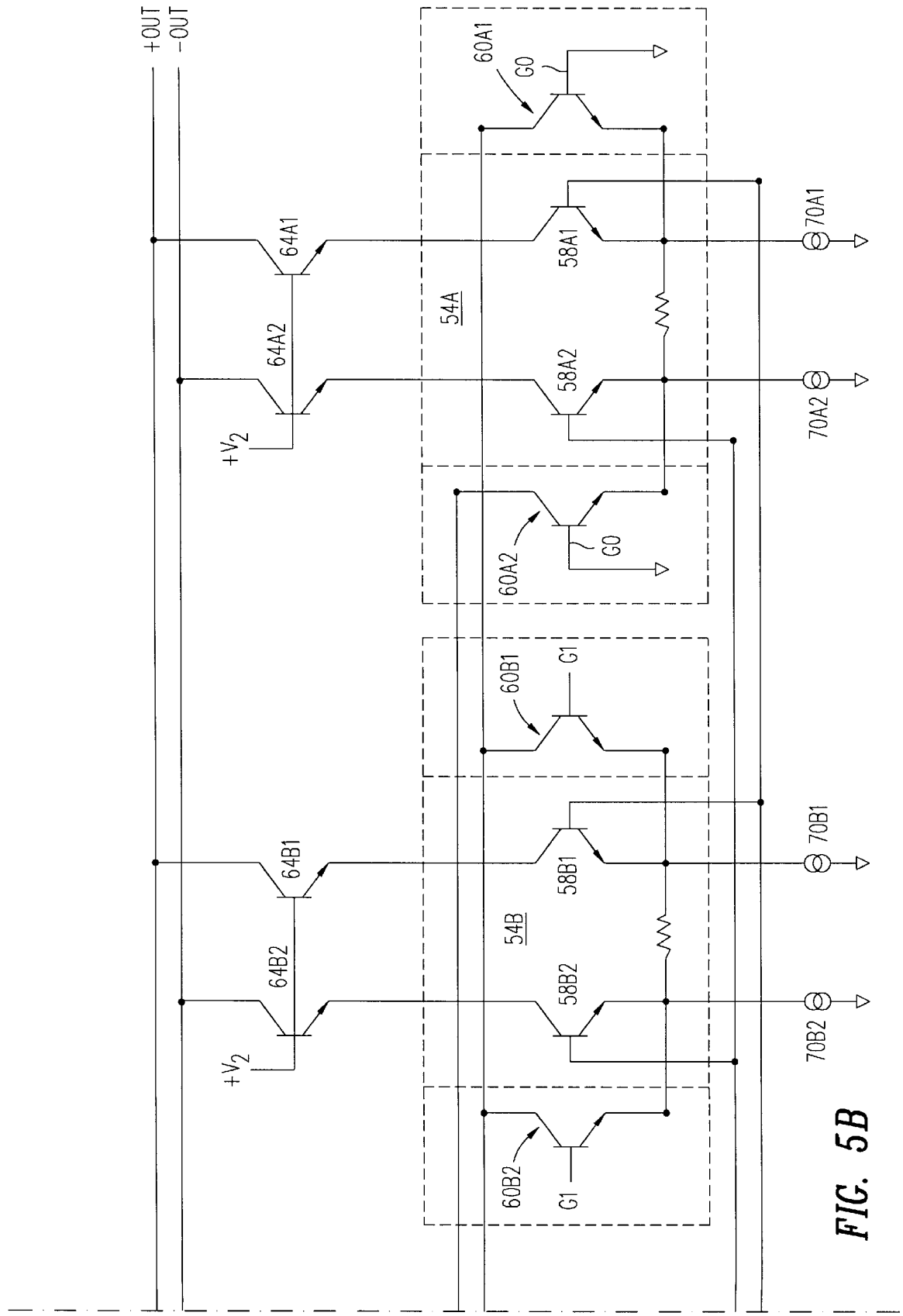
FIG. 5 is a schematic diagram of one embodiment of the improved variable gain amplifier of the present invention.

Referring to FIG. 5, there is shown a schematic diagram of the improved variable gain amplifier 50 of the present invention. The amplifier 50 comprises a pair of input buses 52a and 52b for receiving the input signals +IN and −IN.

The input signals supplied along the pair of input buses 52a and 52b are supplied to a plurality of amplifier stages 54(a–h). As will be seen later, when the present invention is used as a multiplexer, different pairs of input signals are supplied to different amplifier stages 54(a–h).

Each of the amplifier stages 54x comprises a pair of transistors $58_{x2}$ and $58_{x1}$. The bases of these transistors 58 are connected to the input buses 52a and 52b respectively to receive the input signals. The emitters of these transistors $58_{x1}$ and $58_{x2}$ are connected in common and to a respective current source $70_{x1}$ and $70_{x2}$. As will be appreciated by those skilled in the art, a single current source can be supplied to each amplifier stage 54.

Associated with each amplifier stage 54(a–h) and in particular associated with each of the transistors $58_{x1}$, and $58_{x2}$, is a pair of switching transistors $60_{x1}$ and $60_{x2}$. Each of the switching transistors $60_{x1}$ and $60_{x2}$ has bases that are for receiving the logic control signals. When the signal is low, current is permitted to pass from the collector to the emitter. The emitters of the switching transistors $60_{x1}$ and $60_{x2}$ are commonly connected to the emitters of the associated amplifier transistors $58_{x1}$ and $58_{x2}$. As previously discussed, for one of the amplifier stages, 54a, the associated switching transistors $60_{a2}$ and $60_{a1}$ have their bases connected to ground so that they are in the "ON" mode all the time.

The collectors of all of the switching transistors $60(a–h)_2$ and $60(a–h)_1$ are connected to a pair of bypass buses 62a and 62b respectively. A pair of bypass transistors 68a and 68b connect the pair of bypass buses 62a and 62b to a pair of output buses 66a and 66b. The pair of bypass transistors 68a and 68b have collectors that are connected to the output buses 66a and 66b and emitters connected to the bypass buses 62a and 62b. The bases of the bypass transistors 68a and 68b are connected to a bias voltage such as $V_2$.

Finally, associated with each amplifier stage 54x is a pair of control transistors $64x_1$ and $64x_2$. Each of the pair of control transistors $64x_1$ and $64x_2$ has collectors that are connected to the output buses 66a and 66b and emitters that are connected to the collectors of the amplifier transistors $58x_1$ and $58x_2$ of its associated amplifying stage. Thus, in the embodiment shown in FIG. 5, there are as many pairs of control transistors 64 as there are of amplifying stages 54. Finally, a pair of resistors RLA and RLB connect the output buses 66a and 66b to a voltage source.

As can be seen from the foregoing, each of the pair of amplifying transistors 58 has its own associated pair of cascode control transistors 64. Furthermore, the pair of bypass buses 62a and 62b are used to carry the DC current from the switching transistors $60x_1$ and $60x_2$. The additional set of bypass transistors 68a and 68b is used as a cascode to return this current to the load resisters RLA and RLB.

The operation of the VGA circuit 50 can be understood as follows. When the control signal, e.g. G7, is low, it turns off the associated transistors $60h_1$ and $60h_2$ which allows current from current source $70h_2$ and $70h_1$ to flow through amplifying transistors $58h_2$ and $58h_1$. Under this condition, a signal current passes from the collectors of transistors $58h_2$ and $58h_1$ through the associated control transistors $64h_2$ and $64h_1$ acting in a cascode mode to output load resistors RLA and RLB.

When the logic signal, e.g. G7 is switched to a high voltage level, relative to input voltages appearing at the inputs +IN and −IN, current from the sources $70h_2$ and $70h_1$ are shunted away from amplifying transistors $58h_2$ and $58h_1$. This current is then directed via bypass bus 62a and 62b through the associated cascode control transistors 68a and 68b to the output load resistors RLA and RLB.

Under this condition, when no current flows through the associated amplifying transistors $58h_1$ and $58h_2$ there will be no current flow through the associated cascode transistors $64h_1$ and $64h_2$. This causes the control transistors $64h_1$ and $64h_2$ to go into a high impedance state, because their impedances are inversely related to the current flowing through them. In this high impedance state, there is no longer a feed forward path in which the signal from the inputs +IN and −IN can be coupled to the output load resistors. The input signals at +IN and −IN are still present and the collector-base capacitances of amplifying transistors $58h_1$ and $58h_2$ still couple signals to the collectors of amplifying transistors $58h_1$ and $58h_2$. However, there is no longer a path through the associated control transistors $64h_1$ and $64h_2$, because without DC current they are essentially switched off. Thus, the feedforward current is effectively blocked.

Since the feedforward current is effectively blocked, the frequency response of the amplifier 50 will not have the high frequency peaking as discussed previously, but will be essentially flat over the useful bandwidth of the amplifier.

The VGA circuit 50 of the present invention can also be used as an analog multiplexer if independent pairs of input signals are supplied to each of the amplifying stages 54(*a–h*). In that event, the activation of the control signals Gx would activate different input stages and connect different input signals to the output buses 66*a* and 66*b*.

Although the VGA circuit 50 shown in FIG. 5 effectively blocks the feed forward current, it uses one pair of control transistors $64x_1$ and $64x_2$ for each amplifying stage 54*x*. These pairs of control transistors $64x_1$ and $64x_2$ add a substantial amount of capacitance to the output nodes +OUT and −OUT which reduces the bandwidth of the amplifier 50.

Figures 6, 6A:
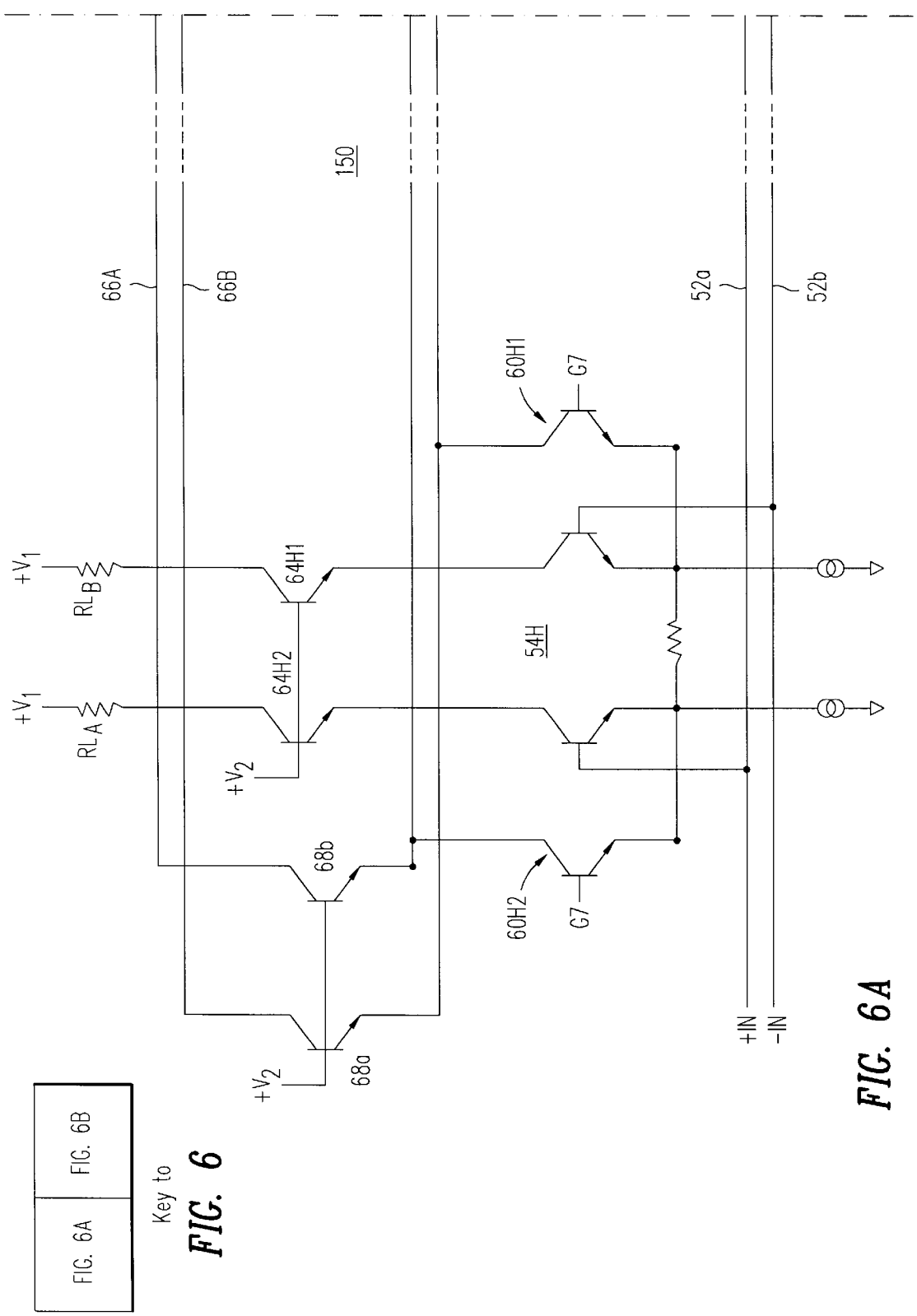
FIG. 6 is a preferred embodiment of an improved variable gain amplifier of the present invention.
Figure 6B:
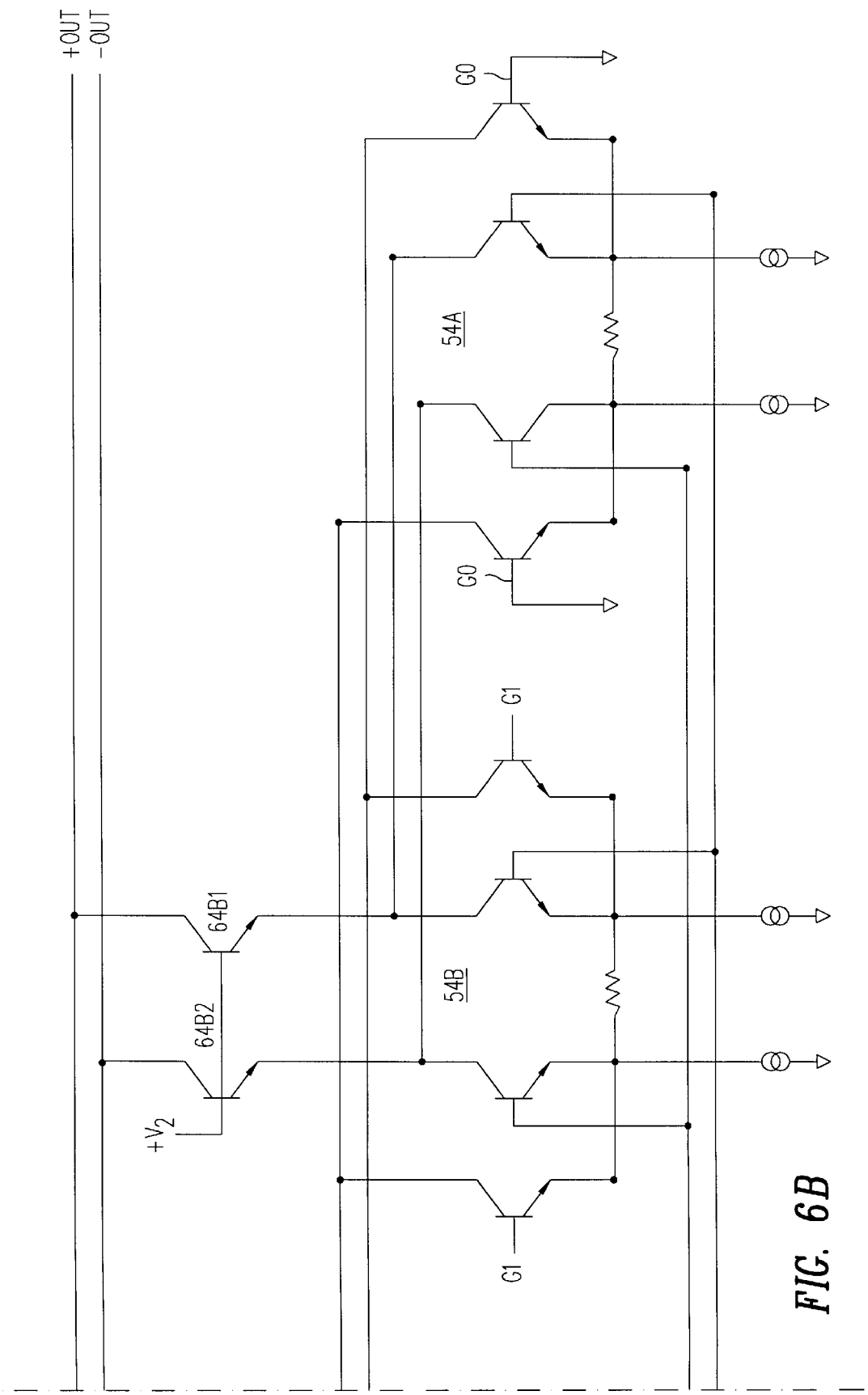

Referring to FIG. 6, there is shown another embodiment of a VGA amplifier 150 of the present invention. The VGA 150 of the present invention shown in FIG. 6 is identical to the VGA 50 shown in FIG. 5, except a pair of amplifying stages share a pair of common control transistors 64. Thus, for example, amplifying stages 54*a* and 54*b* share the pair of control transistors $64b_1$ and $64b_2$. Therefore, with eight (8) amplifying stages 54(*a–h*), four (4) pairs of control transistors 64(*b, d, f,* and *h*) are provided. This amplifier 150 uses the same principle feedforward current blocking and has improved bandwidth and is the preferred embodiment of the invention.

By removing four (4) pairs of control transistors 64, the bandwidth of the VGA amplifier 150 is substantially improved, without adding significant peaking. In this embodiment, the collector of the amplifying transistors $58a_1$ and $58a_2$ of the amplifying stage 54*a* are connected in common to the collectors of the amplifying transistors $58b_1$ and $58b_2$ of the amplifying stage 54*b*. These commonly connected collectors are also connected to the emitters of the control transistors $64b_1$ and $64b_2$. Similarly, the collectors of the amplifying transistors $58c_1$ and $58c_2$ of amplifying stage 54*c* are connected to the collectors of the amplifying transistors $58d_1$ and $58d_2$ of the amplifying stage 54*d*, which are connected to the emitters of a pair of control transistors $64d_1$ and $64d_2$.

In operation, at low gain, where only amplifying stage 54*a* is on, and all the other amplifying stages 54(*b–h*) are off, feedforward current is blocked from the amplifying stages 54(*c–h*) as discussed before. However, there is a small amount of feedforward current supplied from the amplifying stage 54*b*. This is because its associated cascode transistors $64b_1$ and $64b_2$ cannot be turned off because it is shared with the amplifying transistors 58*a* from the amplifying stage 54*a*. Therefore, in the worse case, only one amplifying stage 54*x* is supplying unwanted feedforward current.

Similar to the foregoing description for the VGA circuit 50 shown in FIG. 5, the VGA circuit 150 can be used as an analog multiplexer by simply having different pairs of input signals connected to each of the different amplifying stages.

Other variations of this "shared" control transistors are also possible. To further improve on the low gain portion of operation for the VGA 150, a first pair of control transistors 64*a* can be connected to the amplifying stage 54*a*. A second pair of control transistors 64*b* can be connected to the second amplifying stage 54*b*. A third pair of control transistors 64*c* can be shared by the amplifying stages 54*c* and 54*d*. Finally, a fourth pair of control transistors 64*d* can be shared by the amplifying stages 54(*e–h*). All in all, still only four (4) pairs of control transistors 64 are used. However, at low gain where only one amplifying stage is activated, amplifying stage 54*a*, there is no unwanted feedforward current because control transistors 64(*b–d*) which service the amplifying stages 54(*b–h*) are all off. Even at the low gain where two amplifying stages are on, i.e. 54*a* and 54*b*, there is no feedforward current. It is only at the low gain stage where three (3) amplifying stages are on 54 (*a–c*), that the DC current from one amplifying stage 54*d* provides a minimal amount of unwanted feedforward current.

Other possibilities of sharing pairs of control transistors 64 can include reducing the number of pairs of control transistors 64 by having a first pair of control transistors 64 controlling amplifying stages 54*a* and 54*b* and a second pair of control transistors 64 servicing the amplifying stages 54(*c–h*). This reduces the number of pairs of control transistors to two.

From the foregoing, it can be seen that due to the blocking of the unwanted feed forward current, the magnitudes of the desired signal currents and the DC currents may be made small, and power consumption of the VGA 50 or 150 of the present invention is greatly reduced. Thus, the invention is useful in lower power applications, such as mobile telephony using battery power. Furthermore, speed is also increased.

Figure 3:
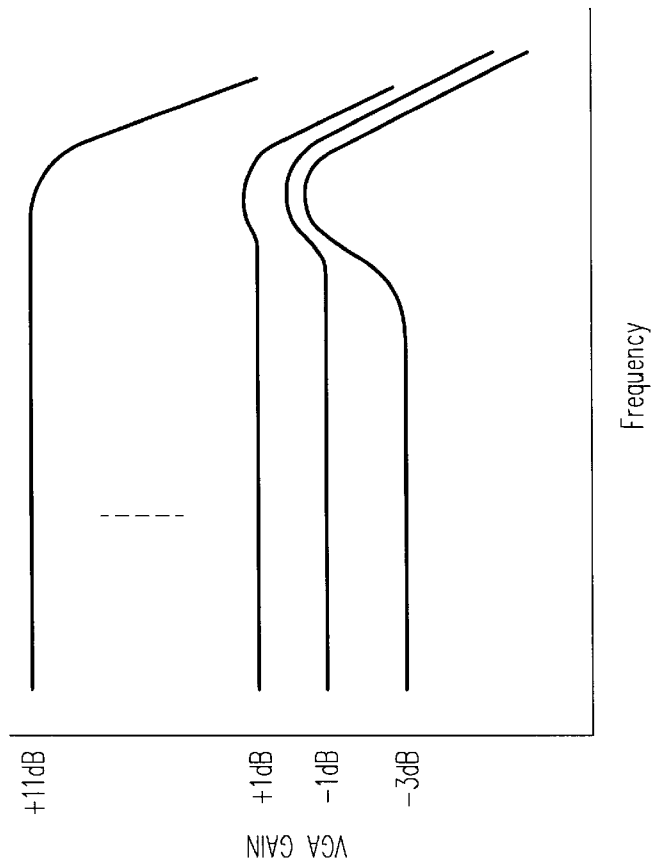
FIG. 3 is a graph showing the frequency response versus gain of the circuit shown in FIGS. 1 and 2.
Figure 1:
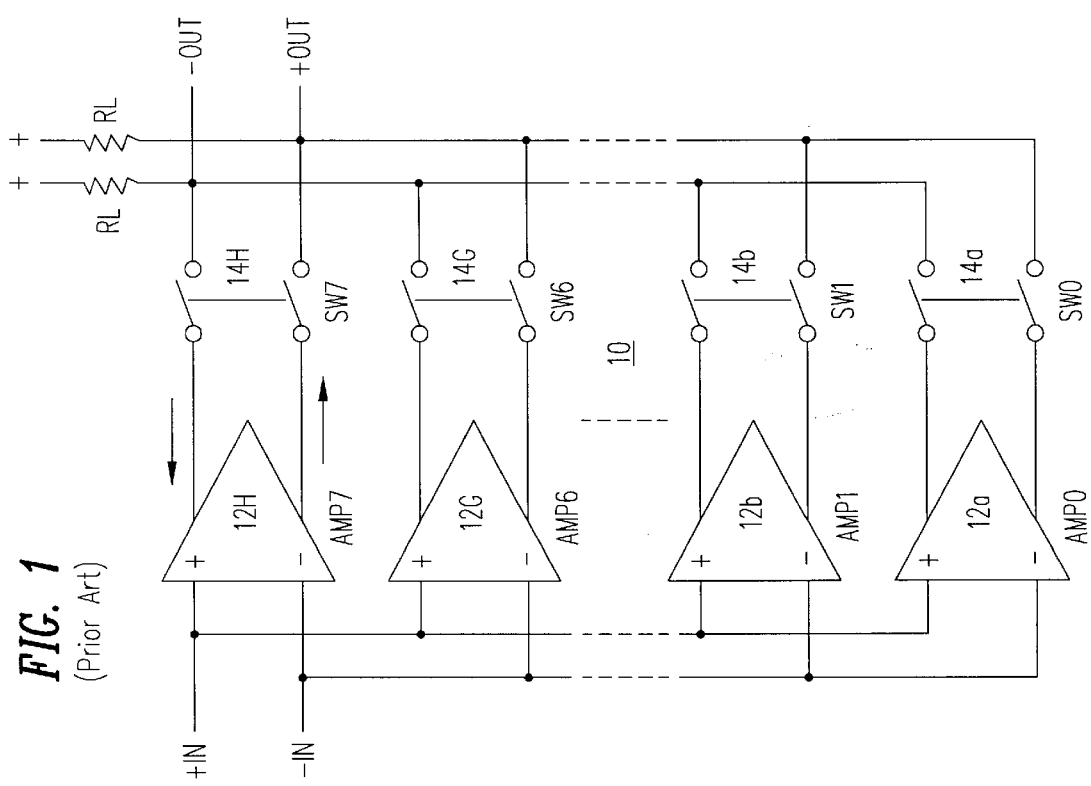
FIG. 1 is a block level diagram of a variable gain amplifier or multiplexer of the prior art.
Figure 2:
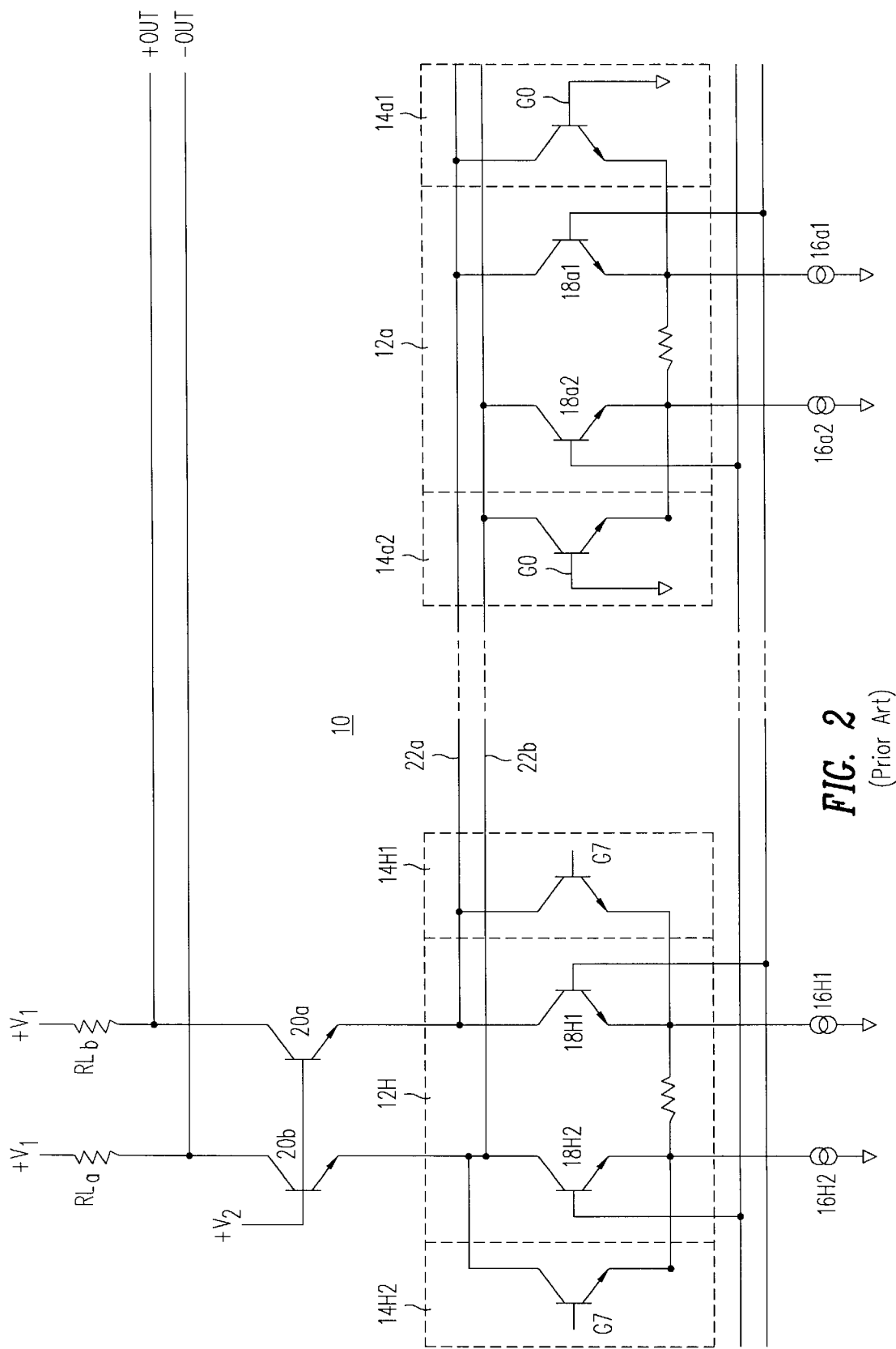
FIG. 2 is a detailed schematic diagram of the circuit shown in FIG. 1.
Figure 4:
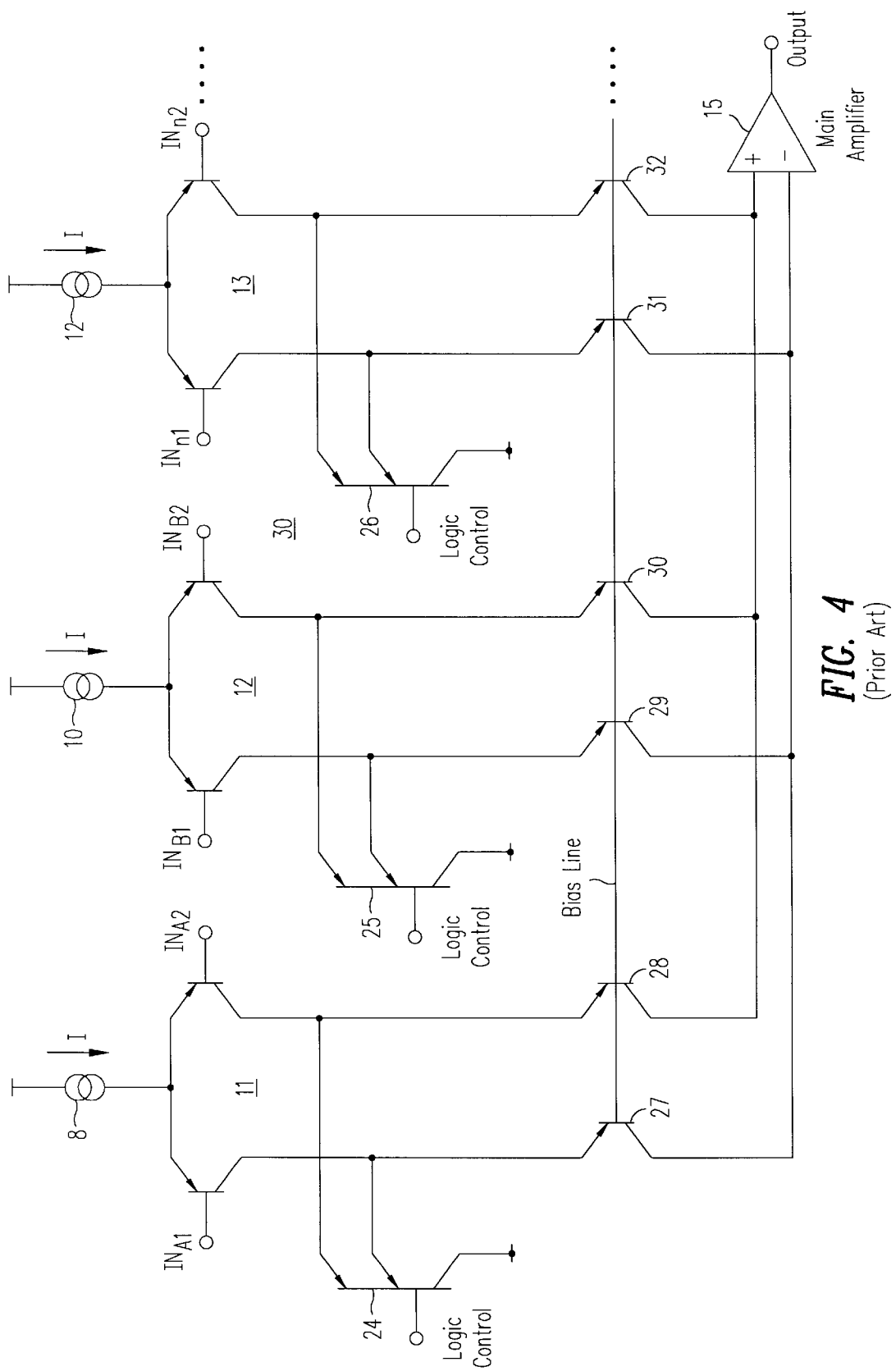
FIG. 4 is a circuit diagram of an analog multiplexer of the prior art.

Although the foregoing description of the VGA 50 and the VGA 150 discloses logic means 14*a* in FIG. 1, $60_{a1}$, and $60_{a2}$ in FIG. 5 and FIG. 6, these devices are not required because they are always in the "switch closed" position. They typically are included for convenience in integrated circuit mask design or for amplifier matching reasons, but they may be omitted without departing from the spirit of the invention. Finally, although foregoing has descibed the use of NPN transistors, this invention is not limited to the particular type of conductivity of the transistor. In addition, other types of transistors such as FET transistors or heterojunction devices can be used as well. Therefore, as used herein and in the claims, collectors, bases and emitters can also mean sources, gates and drains and other equivalents.

What is claimed is:

1. A variable gain amplifier comprising:
   a plurality of input stages, each having a pair of transistors having bases, collectors and emitters, with emitters connected to receive bias signals, and bases for receiving input signals;
   logic means associated with at least one input stage, including a pair of transistors having bases, collectors and emitters; with emitters commonly connected to emitters of the associated input stage; and with bases for receiving logic signals for selectively shunting collector currents therethrough in response to applied logic signals;

a pair of by-pass buses, coupled to a pair of output buses and to the collectors of the pair of transistors of said logic means; and coupling transistors having bases, collectors and emitters; with emitters connected to the collectors of transistors of at least one input stage, with collectors connected to said pair of output buses, and with bases connected to a source of bias signal.

2. The amplifier of claim 1 wherein the transistors of said input stage, said logic means and said coupling transistors are all transistors of the same conductivity type.

3. The amplifier of claim 1 wherein said emitters of each of said input stages are commonly connected.

4. The amplifier of claim 1 wherein said bases of said coupling transistors are commonly connected.

5. The amplifier of claim 1 wherein said emitters of said coupling transistors are connected to the collectors of a plurality of input stages.

6. The amplifier of claim 1 further comprising a pair of first transistors for coupling said pair of by-pass buses to said output buses, said pair of first transistors having emitters connected to said by-pass buses; collectors connected to said output buses, and bases to a bias voltage.

7. A variable gain amplifier comprising:

a plurality of amplifier stages, each amplifier stage including a pair of inputs, a pair of outputs, and a pair of controls, with said pair of outputs for forming output signals from input signals supplied to said pair of inputs;

a pair of output buses;

a pair of DC bypass buses;

each amplifier stage further comprising:

a pair of first transistor means having a pair of bases, a pair of collectors and a pair of emitters; said pair of bases for receiving said pair of controls, said pair of emitters connected to one another; and said pair of collectors connected to said pair of DC bypass buses;

a pair of second transistor means having a pair of bases, a pair of collectors and a pair of emitters, said pair of bases for receiving said pair of inputs; said pair of emitters connected to said pair of emitters of said first transistor means and to a current source;

a pair of third transistor means having a pair of bases, a pair of collectors, and a pair of emitters; said pair of bases connected to a bias voltage; said pair of emitters connected to said pair of collectors of said second transistors of at least one of said plurality of amplifier stages; said pair of collectors connected to said pair of output buses; and a pair of fourth transistor means having a pair of bases, a pair of collectors, and a pair of bases connected to a bias voltage; said pair of emitters connected to said pair of DC bypass buses; said pair of collectors connected to said pair of output buses.

8. The amplifier of claim 7 wherein each of said emitters of said second transistor means is connected to a separate current source.

9. The amplifier of claim 7 wherein said pair of bases of said third transistor means are connected to each other and to a bias voltage.

10. The amplifier of claim 7 wherein said pair of bases of said fourth transistor means are connected to each other and to a bias voltage.

11. The amplifier of claim 7 wherein said pair of emitters of said third transistor means is connected to said pair of collectors of said second transistors of a plurality of said amplifier stages.

12. An analog multiplexer of the type having a plurality of input stages, each having a pair of transistors having emitters, bases and collectors with emitters connected to receive bias signal, and bases to receiving input signals; logic means associated with each input stage, including a pair of transistors having bases, collectors and emitters, with bases for receiving logic signals for selectively shunting collector currents therethrough in response to logic signals; coupling transistors having bases, collectors and emitters, with emitters connected to the collectors of at least one input stage, with collectors connected to a pair of output buses and with bases connected to a source of bias signal, wherein the improvement comprising:

said emitters of said logic means connected to said emitters of said associated input stage;

a pair of by-pass buses coupled to said pair of output buses; and said collectors of said logic means connected to said pair of by-pass buses.

13. The multiplexer of claim 12 wherein the transistors of said input stage, logic means and coupling transistors are all transistors of the same conductivity type.

14. The multiplexer of claim 12 wherein said emitters of each of said input stages are commonly connected.

15. The multiplexer of claim 12 wherein said bases of said coupling transistors are commonly connected.

16. The multiplexer of claim 12 wherein said emitters of said coupling transistors are connected to the collectors of a plurality of input stages.

17. The multiplexer of claim 12 further comprising a pair of first transistors for coupling said pair of by-pass buses to said pair of output buses, said first transistors having emitters connected to said pair of by-pass buses; collectors connected to said pair of output buses, and bases to a bias voltage.

\* \* \* \* \*